United States Patent
Kamata

(10) Patent No.: US 7,184,343 B2
(45) Date of Patent: Feb. 27, 2007

(54) NONVOLATILE SEMICONDUCTOR MEMORY DEVICE PROVIDING STABLE DATA READING

(76) Inventor: Yoshihiko Kamata, c/o Mentor Graphics Japan Co., Ltd., Gotenyama Hills, 7-35, Kita-shinagawa 4-chome, Shinagawa-ku, Tokyo 140-0001 (JP)

( * ) Notice: Subject to any disclaimer, the term of this patent is extended or adjusted under 35 U.S.C. 154(b) by 0 days.

(21) Appl. No.: 10/843,840

(22) Filed: May 11, 2004

(65) Prior Publication Data
US 2005/0047234 A1    Mar. 3, 2005

(30) Foreign Application Priority Data
Aug. 29, 2003   (DE) ............................. 2003-306491

(51) Int. Cl.
*G11C 7/00* (2006.01)
(52) U.S. Cl. ...................... 365/205; 365/210
(58) Field of Classification Search ................ 365/205, 365/185.21, 210, 196, 207
See application file for complete search history.

(56) References Cited

U.S. PATENT DOCUMENTS

| | | | | |
|---|---|---|---|---|
| 5,321,655 A | * | 6/1994 | Iwahashi et al. | ....... 365/185.21 |
| 5,528,543 A | * | 6/1996 | Stiegler | ....................... 365/207 |
| 5,815,450 A | * | 9/1998 | Kimura | ....................... 365/203 |
| 5,982,693 A | * | 11/1999 | Nguyen | ....................... 365/208 |
| 5,991,188 A | * | 11/1999 | Chung et al. | ................ 365/145 |
| 6,317,362 B1 | | 11/2001 | Nomura et al. | |
| 6,327,202 B1 | * | 12/2001 | Roohparvar | ................. 365/203 |
| 6,400,606 B1 | * | 6/2002 | Cho | ........................ 365/185.2 |
| 6,674,668 B2 | * | 1/2004 | Ikehashi et al. | ........ 365/185.24 |
| 6,781,873 B2 | * | 8/2004 | Ishikawa et al. | ............ 365/158 |
| 6,795,350 B2 | * | 9/2004 | Chen et al. | ............ 365/189.07 |

\* cited by examiner

*Primary Examiner*—Thong Q. Le
(74) *Attorney, Agent, or Firm*—Klarquist Sparkman

(57) ABSTRACT

A nonvolatile semiconductor memory device includes a first memory cell having a conductive/nonconductive state thereof substantially controlled in response to data stored therein and providing passage of a first current amount in the conductive state, a first bit line connected to the first memory cell, a reference cell connected to the first bit line and providing passage of a second current amount smaller than the first current amount, a second bit line, a second memory cell connected to the second bit line and providing passage of the first current amount, and a sense amplifier connectable to the first bit line and the second bit line through electrical couplings.

16 Claims, 7 Drawing Sheets

NONVOLATILE SEMICONDUCTOR MEMORY DEVICE PROVIDING STABLE DATA READING

BACKGROUND OF THE INVENTION

1. Field of the Invention

The present invention generally relates to nonvolatile semiconductor memory devices, and particularly relates to a nonvolatile semiconductor memory device which detects data by comparing a data current supplied from a memory cell with a reference current supplied from a reference cell.

2. Description of the Related Art

In nonvolatile semiconductor memory devices, memory cells (memory cell transistors) are arranged in an array, and an electric current flows from a selected bit line to a memory cell that is connected to a selectively activated word line. The sensing of this electric current reveals what data is stored in the memory cell, which has been selected both in an X direction and in a Y direction. In such data sensing, generally, an electric current flowing from a selected bit line to a selected memory cell is compared by a sense amplifier with an electric current running through a reference cell that is provided as a reference.

FIG. 1 is a circuit diagram showing the construction of a related-art nonvolatile semiconductor memory device in respect of a portion relevant to data reading. The circuit of FIG. 1 includes a memory cell array 10, a reference cell unit 11, a sense amplifier 13, and gate transistors 14, 15, 16-0, 16-1, 16-2, and 17. The memory cell array 10 includes memory cells (i.e., memory cell transistors) M00 through M02, M10 through M12, M20 through M22, and M30 through M32 arranged in an array. For the sake of convenience of illustration, memory cells are shown as constituting a 3×4 matrix. In actual construction, however, a larger number of memory cells are arranged in an array. A plurality of memory cells arranged in the same row extending in a horizontal direction have gate nodes thereof connected to the same word line. In total, four word lines WL0 through WL3 are provided.

A plurality of memory cells arranged in the same column extending in a vertical direction have drain nodes thereof connected to the same bit line. In total, three bit lines BL0 through BL2 are provided.

The reference cell unit 11 includes reference cells (i.e., reference cell transistors) MR0 and MR1. The reference cell (reference cell transistor) MR0 has a gate node thereof connected to the word line WLR0, and the reference cell (reference cell transistor) MR1 has a gate node thereof connected to the word line WLR1. The drain nodes of the reference cells MR0 and MR1 are connected to a bit line BLR provided for the reference purpose. The transistors of the reference cells have gm (transconductance) that is adjusted to half the size of that of the memory cell transistors. Moreover, source nodes of the memory cells and the reference cells are all fixed to a common potential (array source AS).

When an even-numbered word line WL0 or WL2 is selected in the memory cell array 10, the word line WLR0 is activated in the reference cell unit 11. When an odd-numbered word line WL1 or WL3 is selected in the memory cell array 10, the word line WLR1 is activated in the reference cell unit 11. It should be noted that the memory cells on the upper side of the array source AS are arranged symmetrically with the memory cells on the lower side of the array source AS. With the provision as described above, differences in characteristics are absorbed between memory cells provided on the lower side of the array source AS (i.e., memory cells connected to the even-numbered word line WL0 or WL2) and memory cells provided on the upper side of the array source AS (i.e., memory cells connected to the odd-numbered word line WL1 or WL3).

The sense amplifier 13 is a differential-type amplifier, and is provided with an input terminal DL connected to the memory cell array 10 and an input terminal DLR connected to the reference cell unit 11.

The gate transistors 16-0 through 16-2 together constitute a bit-line selecting gate unit for selecting a bit line, and their gate nodes receive selection signals Y0 through Y2, respectively. As one of the bit-line selection signals Y0 through Y2 is selectively set to HIGH, a corresponding one of the three bit lines BL0 through BL2 is selected. The selected bit line is coupled to the input terminal DL of the sense amplifier 13 through the gate transistor 17.

Moreover, the bit line BLR provided for the reference purpose is coupled to the input terminal DLR of the sense amplifier 13 through the gate transistors 14 and 15. The gate transistors 14 and 15 each have the same characteristics as the gate transistors 16-0 through 16-2, and are provided for the purpose of providing the same load on the electric current path of the memory cell array and on the electric current path of the reference cell unit.

In the following, a description will be given of a basic operation of data reading. For the sake of convenience of explanation, an example to be described here is directed to a system in which an array source is set to the ground, and the two input nodes DL and DLR of the sense amplifier 13 provide respective potentials.

A description will be given of a case in which data "0" stored in the memory cell M10 is read. While the word line WL1 is activated, the gate transistors 16-0 and 17 are made conductive. As a result, the memory cell M10 is coupled to the input terminal DL of the sense amplifier 13. Electric discharge occurs from the input terminal DL to the array source AS through the bit line BL0 and the memory cell M10. The amount of current flowing out of the input terminal DL is referred to as Icel0N. Icel0N is equal to Icel0, which is the amount of current that runs through a memory cell having data "0" stored therein.

On the reference side, the word line WLR1 is activated to make the gate transistors 14 and 15 conductive. As a result, the reference cell MR1 is coupled to the input terminal DLR of the sense amplifier 13. Electric discharge occurs from the input terminal DLR to the array source AS through the reference bit line BLR and the reference cell MR1. The amount of current flowing out of the input terminal DLR is referred to as Iref. Iref is 0.5Icel0, which is half the amount of Icel0. This is because gm of a reference cell is set to half the size of gm of a memory cell.

Accordingly, respective potentials V(DL) and V(DLR) of the two inputs DL and DLR of the sense amplifier 13 are related as: V(DL)<V(DLR), resulting in the sense amplifier 13 outputting data "0".

When data "1" is stored in the memory cell M10, on the other hand, the memory cell M10 does not become conductive in response to the activation of the word line WL1. As a result, Icel0N that is the amount of an electric current flowing out of the input terminal DL of the sense amplifier 13 is 0, so that V(DL)>V(DLR). This results in the sense amplifier 13 outputting data "1".

In the nonvolatile semiconductor memory device described above, the sense amplifier 13 may fail to perform proper data sensing because of the presence of capacitance between the bit lines. This will be described in the following.

A case will be examined here in which all the memory cells M00, M32, and M11 store data "1", and data are retrieved from the memory cells M00, M32, and M11 in the order named.

When the memory cell M00 is read first, no current runs through the memory cell M00 storing data "1". In this case, the bit line BL0 is charged to a potential responsive to the amount of electric charge supplied from the input terminal DL of the sense amplifier 13. The sense amplifier 13 thus outputs data "1".

When the memory cell M32 is read next, no current runs through the memory cell M32 storing data "1". As a result, the bit line BL2 is charged to a potential responsive to the amount of electric charge supplied from the input terminal DL of the sense amplifier 13. The sense amplifier 13 thus outputs data "1".

When the memory cell M11 is read further, no current runs through the memory cell M32 storing data "1". It is expected, therefore, that the bit line BL1 is charged to a potential responsive to the amount of electric charge supplied from the input terminal DL of the sense amplifier 13. When this happens, however, the other memory cells M10 and M12 connected to the activated word line WL1 may have data "0" stored therein. In such a case, the bit lines BL0 and BL2 connected to the respective memory cells M10 and M12 are in a charged state by the reading of the memory cells M00 and M32 as described above, and discharge as they are coupled to the array source AS via the respective memory cells M10 and M12. That is, the bit line BL1 that is to be charged and sensed for the reading of data is sandwiched between the bit lines that exhibit an opposite potential change through discharging. As a result, charging of the bit line BL1 is affected by the presence of capacitance between the bit lines, so that the sensing of data by the sense amplifier 13 may fail.

Accordingly, there is a need for a nonvolatile semiconductor memory device in which data sensing is not affected by the presence of capacitance between bit lines.

SUMMARY OF THE INVENTION

It is a general object of the present invention to provide a nonvolatile semiconductor memory that substantially obviates one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a nonvolatile semiconductor memory particularly pointed out in the specification in such full, clear, concise, and exact terms as to enable a person having ordinary skill in the art to practice the invention.

To achieve these and other advantages in accordance with the purpose of the invention, the invention provides a nonvolatile semiconductor memory device including a first memory cell having a conductive/nonconductive state thereof substantially controlled in response to data stored therein and providing passage of a first current amount in the conductive state, a first bit line connected to the first memory cell, a reference cell connected to the first bit line and providing passage of a second current amount smaller than the first current amount, a second bit line, a second memory cell connected to the second bit line and providing passage of the first current amount, and a sense amplifier connectable to the first bit line and the second bit line through electrical couplings.

In at least one embodiment of the invention, the reference cell providing the passage of the second current amount provides a path through which a current runs from the sense amplifier through the first bit line to an array source irrespective of the value of data stored in the selected memory cell that is to be retrieved. With this provision, bit-line electric charge is dissipated to the array source after a sensing operation, so that adjacent bit lines sandwiching a selected bit line are always set to the potential of the array source at the time of a next read operation. Accordingly, the unselected bit lines sandwiching the selected bit line serve as shielding lines, thereby preventing the sensing of data from being affected by the presence of capacitance between bit lines.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 1:
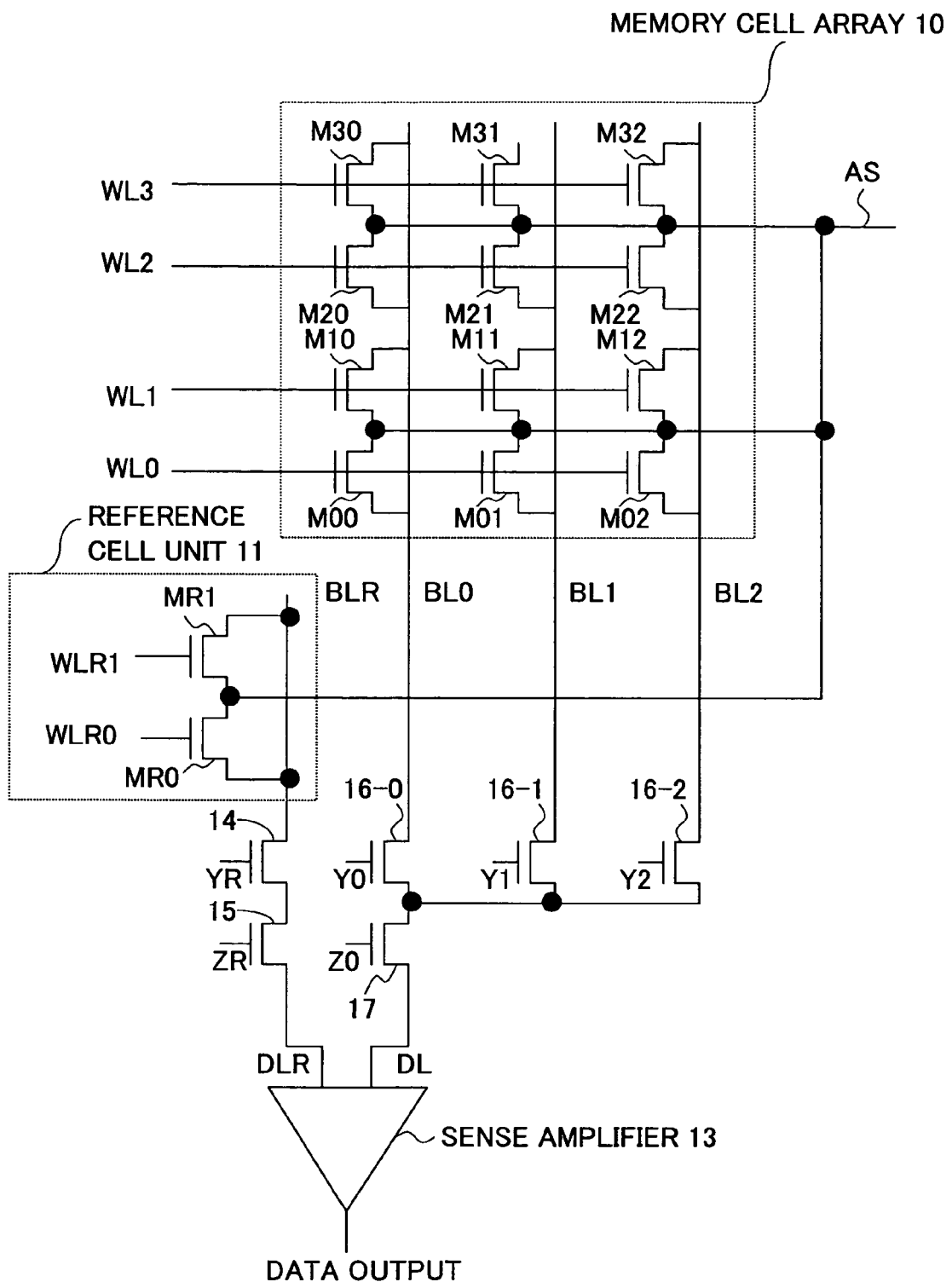
FIG. 1 is a circuit diagram showing the construction of a related-art nonvolatile semiconductor memory device in respect of a portion relevant to data reading.
Figure 2:
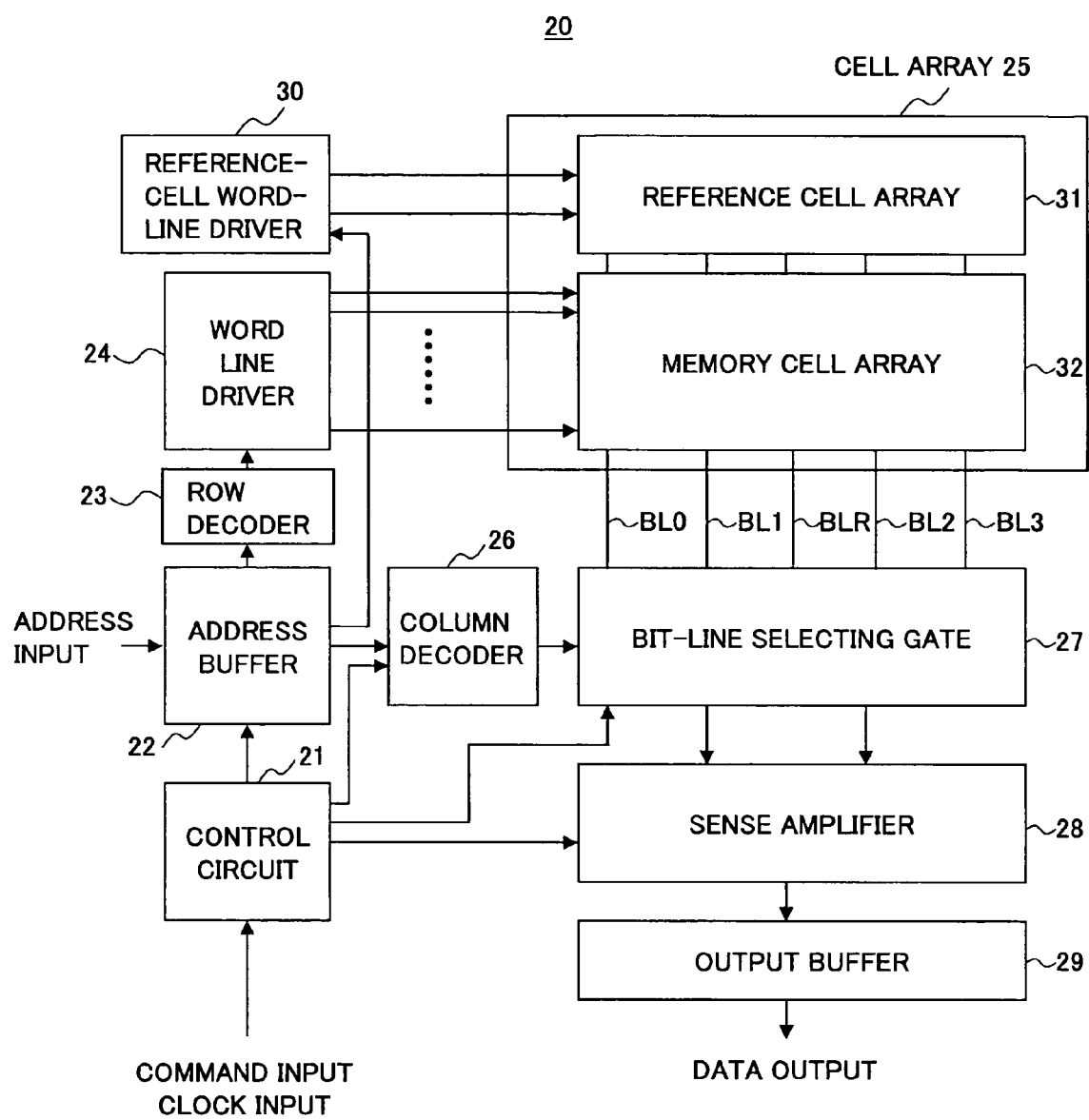
FIG. 2 is a block diagram showing the construction of a nonvolatile semiconductor memory device according to a first embodiment of the invention.

FIG. 2 is a block diagram showing the construction of a nonvolatile semiconductor memory device according to a first embodiment of the invention.

A nonvolatile semiconductor memory device 20 of FIG. 2 includes a control circuit 21, an address buffer 22, a row decoder 23, a word line driver 24, a cell array 25, a column decoder 26, a bit-line selecting gate 27, a sense amplifier 28, an output buffer 29, and a reference-cell word-line driver 30. In the invention, part of cell transistors provided in the cell array 25 is used as a reference cell array 31, and the remainder is used as a memory cell array 32. This construction will be described later in detail.

The control circuit 21 receives a command input and a clock signal input from an exterior of the device. In order to perform an operation specified by the command input, the control circuit 21 generates various control signals for the purpose of controlling various units of the nonvolatile semiconductor memory device. The address buffer 22 receives an address input from the exterior, and latches address signals in response to an instruction from the control circuit 21. The latched address signals are supplied to the row decoder 23 and the column decoder 26.

The row decoder 23 decodes the address signals, and supplies a decoded signal indicative of word selection to the word line driver 24. The column decoder 26 decodes the address signals, and supplies a decoded signal indicative of bit-line selection (column selection) to the bit-line selecting gate 27.

The word line driver 24 activates a word line corresponding to the selected word address. This results in memory cells connected to the activated word line being selected in the memory cell array 32. The bit-line selecting gate 27 controls a conductive/nonconductive state of gate transistors provided therein, thereby coupling a bit line selected from the bit lines BL0 through BL3 to the sense amplifier 28. As a result, the amount of an electric current flowing from the sense amplifier 28 to the selected bit line reflects the value of data stored in a selected memory cell, which is connected to the selected word line and the selected bit line in the memory cell array 32.

Moreover, a reference-purpose bit line BLR is coupled to the sense amplifier 28 through the bit-line selecting gate 27. With this provision, a current flows from the sense amplifier 28 to a memory cell that is connected to the selected word line and the reference-purpose bit line BLR in the memory cell array 32. This memory cell has data "0" stored therein, so that the current flowing through the reference-purpose bit line BLR is set to Icel0. In the reference cell array 31, reference cells are provided such that an electric current equal in amount to 0.5Icel0 flows from the sense amplifier 28 through one of the bit lines BL0 through BL3. Like the related-art construction previously described, the reference cell array 31 has a symmetrical structure that matches the symmetrical structure of memory cells in the memory cell array 32. The reference-cell word-line driver 30 driven in response to a signal from the address buffer 22 selects one of the two sets of reference cells that have symmetric arrangement with each other.

In the invention as described above, the selected bit line selected from the bit lines BL0 through BL3 has an electric current flowing therethrough, which is a sum of a current responsive to the value ("0" or "1") of data stored in the selected memory cell and a fixed current of the reference cell that is equal to 0.5Icel0. The quantity of this electric current is 1.5Icel0 if the data of the selected memory cell is "0", and is 0.5Icel0 if the data of the selected memory cell is "1". Further, as described above, the electric current flowing through the reference-purpose bit line BLR is Icel0. The sense amplifier 28 compares potentials responsive to these two current amounts, thereby sensing (detecting) the value of data stored in the selected memory cell. The detected data value is output to the exterior through the output buffer 29.

In this manner, this invention provides each bit line with a path through which a current runs from the sense amplifier 28 to the array source irrespective of the value of data stored in the selected memory cell that is to be retrieved. With this provision, the electric charge of a bit line is dissipated to the array source after a sensing operation, so that adjacent bit lines sandwiching the selected bit line are always set to the potential of the array source at the time of a next read operation. Accordingly, the unselected bit lines sandwiching the selected bit line serve as shielding lines, thereby preventing the sensing of data from being affected by the presence of capacitance between bit lines.

Figure 3:
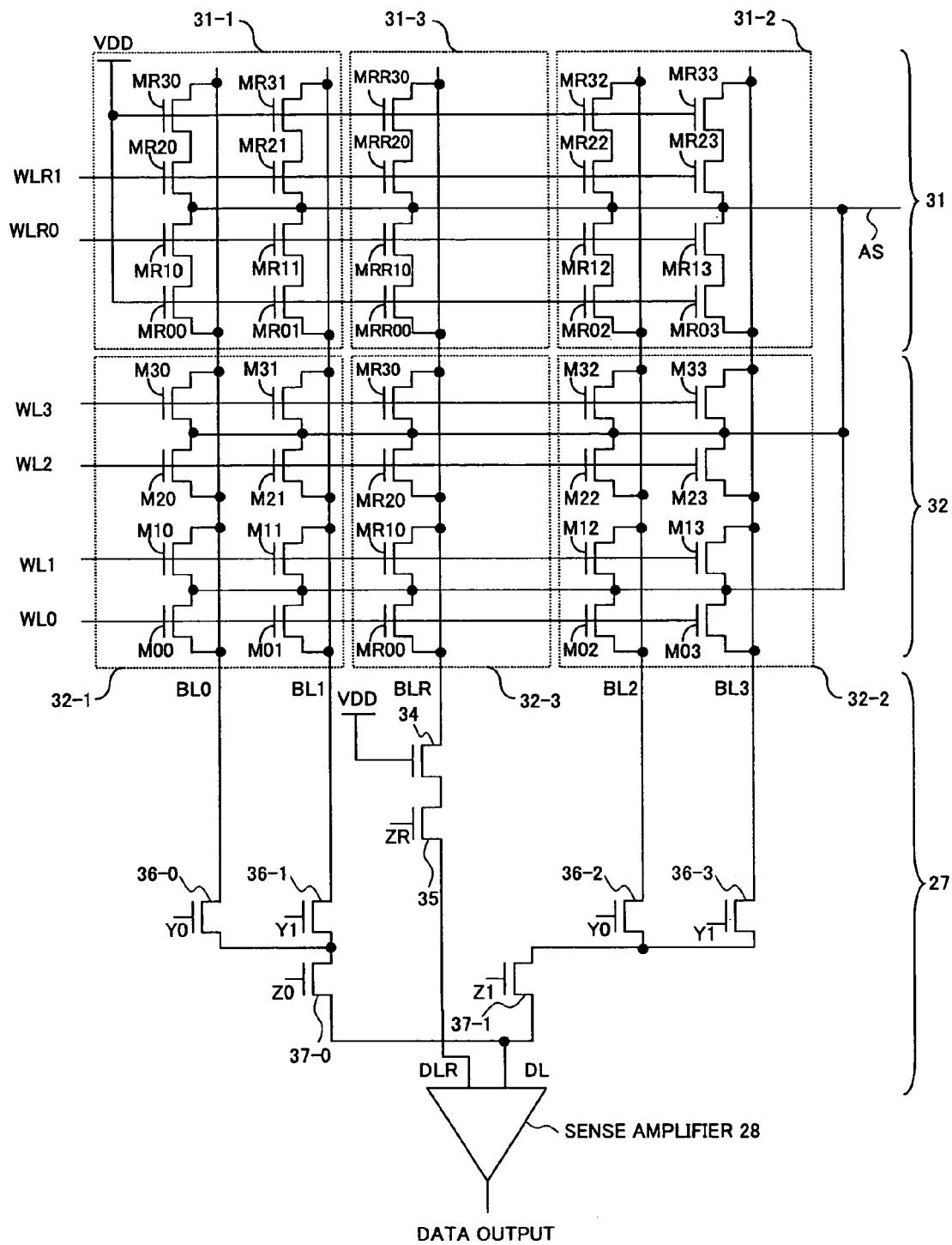
FIG. 3 is a circuit diagram showing the construction of a reference cell array, a memory cell array, and a bit-line selecting gate shown in FIG. 2.

FIG. 3 is a circuit diagram showing the construction of the reference cell array 31, the memory cell array 32, and the bit-line selecting gate 27.

The memory cell array 32 includes memory cell transistors arranged in an array form, and includes data-storage-purpose memory cell portions 32-1 and 32-2 and a reference-purpose memory cell portion 32-3. The data-storage-purpose memory cell portions 32-1 and 32-2 include memory cells (memory cell transistors) M00 through M03, M10 through M13, M20 through M23, and M30 through M33. The reference-purpose memory cell portion 32-3 includes memory cells MR00 through MR30 connected to the reference-purpose bit line BLR. The memory cells MR00 through MR30 of the reference-purpose memory cell portion 32-3 all have data "0" stored therein.

For the sake of convenience of illustration, memory cells are shown as constituting a 5×4 matrix. In actual construction, however, a larger number of memory cells are arranged in an array. A plurality of memory cells arranged in the same row extending in a horizontal direction have gate nodes thereof connected to the same word line. In total, four word lines WL0 through WL3 are provided.

A plurality of memory cells arranged in the same column extending in a vertical direction have drain nodes thereof connected to the same bit line. In total, four bit lines BL0 through BL3 and one reference-purpose bit line BLR are provided. The memory cells in the memory cell portions 32-1 and 32-2 are connected to the bit lines BL0 through BL3, and the memory cells in the memory cell portion 32-3 are connected to the reference-purpose bit line BLR.

The reference cell array 31 is comprised of memory cell transistors arranged in an array form, and includes reference cell portions 31-1 and 31-2 for producing an electric current equal in amount to 0.5Icel0 and a reference cell portion 31-3 for maintaining a repeating structure of the array. The reference cell portions 31-1 and 31-2 include reference cells MR00 through MR03, MR10 through MR13, MR20 through MR23, and MR30 through MR33, all of which have "0" stored therein. The reference cell portion 31-3 includes reference cells MRR00 through MRR30, all of which have "1" stored therein.

A word line WLR0 is connected to the gate node of the reference cells MR10 through MR13 and MRR10, and a word line WLR1 is connected to the gate node of the reference cells MR20 through MR23 and MRR20. The reference cells of the reference cell portion 31-1 and 31-2 are connected to the bit lines BL0 through BL3, and the reference cells of the reference cell portion 31-3 are connected to the reference-purpose bit line BLR.

It should be noted that the transistors of reference cells are formed in the same dimension as the transistors of memory cells, and are adjusted to have the same gm. In the reference cell array 31, two of the transistors of reference cells are connected in series, thereby providing gm that is half the size of that of the transistors of memory cells. Moreover, all the source nodes of the memory cells and reference cells are fixedly coupled to a common potential (i.e., the array source AS).

When the even-numbered word line WL0 or WL2 is selected in the memory cell array 32, the word line WLR0 is activated in the reference cell array 31. When the odd-numbered word line WL1 or WL3 is selected in the memory cell array 32, the word line WLR1 is activated in the reference cell array 31. It should be noted that the memory cells on the upper side of the array source AS are arranged symmetrically with the memory cells on the lower side of the array source AS. With the provision as described above, differences in characteristics are absorbed between memory cells provided on the lower side of the array source AS and memory cells provided on the upper side of the array source AS.

The sense amplifier 28 is a differential-type amplifier, and is provided with an input terminal DL coupled to one of the bit lines BL0 through BL3 and an input terminal DLR coupled to the reference-purpose bit line BLR.

Gate transistors 36-0 through 36-3 and 37-0 through 37-1 together constitute the bit-line selecting gate for selecting a bit line, and have the gate nodes thereof receiving bit line selection signals Y0, Y1, Z0, and Z1 supplied from the column decoder 26 shown in FIG. 2. A specified combination of the bit line selection signals Y0, Y1, Z0, and Z1 provides for one of the four bit lines BL0 through BL3 to be selected. The selected bit line is coupled to the input terminal DL of the sense amplifier 28.

The reference-purpose bit line BLR is coupled to the input terminal DLR of the sense amplifier 28 through the gate transistors 34 and 35. The gate transistors 34 and 35 have the same characteristics as a given one of the gate transistors 36-0 through 36-3 and a given one of the gate transistors 37-0 through 37-1, respectively, and provided for the purpose of providing a current path on the reference-cell side with the same load as a current path on the memory-cell side.

In the following, a description will be given of a basic operation of data reading. For the sake of convenience of explanation, an example to be described here is directed to a system in which an array source is set to the ground, and the two input nodes DL and DLR of the sense amplifier 28 provide respective potentials.

A description will be given of a case in which data "0" stored in the memory cell M10 is read. While the word line WL1 is activated, the gate transistors 36-0 and 37-0 are made conductive. As a result, the memory cell M10 is coupled to the input terminal DL of the sense amplifier 28. Moreover, the word line WLR0 for the reference purpose is activated, so that the reference cells MR10 and MR00 connected in series are coupled to the input terminal DL of the sense amplifier 28.

Electric discharge occurs from the input terminal DL to the array source AS through the bit line BL0 and the memory cell M10. The amount of this electric current is equal to Icel0. Furthermore, electric discharge occurs from the input terminal DL to the array source AS through the bit line BL0 and the memory cells MR10 and MR00. The amount of this electric current is equal to 0.5Icel0. Accordingly, the amount of an electric current flowing out of the input terminal DL is 1.5Icel0 in total.

Moreover, the reference-purpose bit line BLR is coupled to the input terminal DLR of the sense amplifier 28 by turning on the gate transistor 35 with a signal ZR supplied from the control circuit 21 shown in FIG. 2. The reference-purpose memory cell MR10 of the memory cell array 32 connected to the reference-purpose bit line BLR stores "0", and is in an activated state in response to the activation of the word line WL1. As a result, electric discharge occurs from the input terminal DLR to the array source AS via the reference-purpose bit line BLR and the reference cell MR10. The amount of this electric current flowing out of the input terminal DLR is Icel0.

Since "1" is stored in the reference cells of the reference cell portion 31-3 of the reference cell array 31, no electric current runs from the reference-purpose bit line BLR to the array source AS in the reference cell array 31.

Therefore, respective potentials V(DL) and V(DLR) of the two inputs DL and DLR of the sense amplifier 28 are related as: V(DL)<V(DLR), resulting in the sense amplifier 28 outputting data "0".

When data "1" is stored in the memory cell M10, the memory cell M10 does not become conductive in response to the activation of the word line WL1. Therefore, the amount of an electric current flowing out of the input terminal DL of the sense amplifier 28 is 0.5Icel, so that V(DL)>V(DLR). Consequently, the sense amplifier 28 outputs data "1".

In this manner, this invention provides each bit line with a path through which a current runs from the sense amplifier 28 to the array source irrespective of the value of data stored in the selected memory cell that is to be retrieved. With this provision, the electric charge of a bit line is dissipated to the array source after a sensing operation, so that adjacent bit lines sandwiching the selected bit line are always set to the potential of the array source at the time of a next read operation. Accordingly, the unselected bit lines sandwiching the selected bit line serve as shielding lines, thereby preventing the sensing of data from being affected by the presence of capacitance between bit lines.

Figure 4:
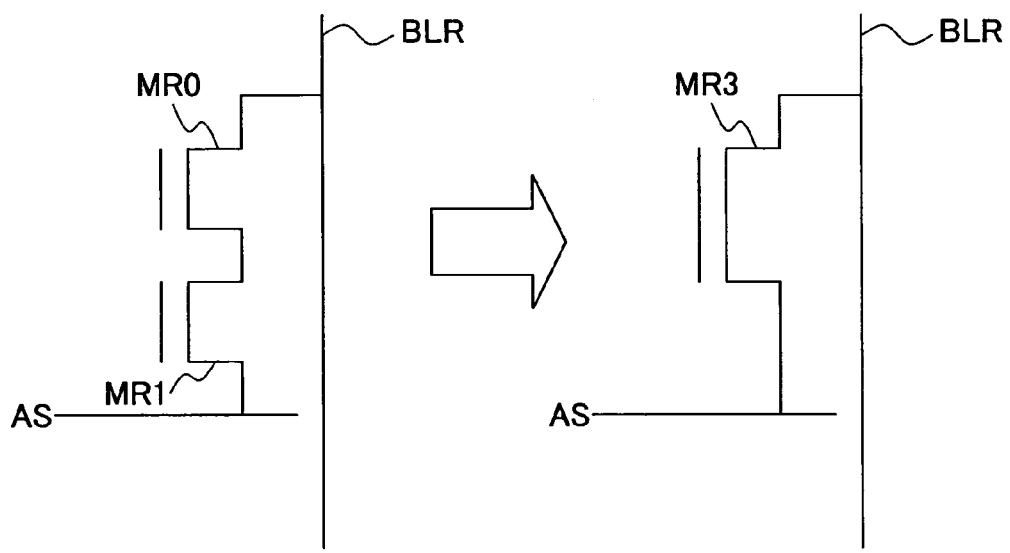
FIG. 4 is a drawing showing a construction in which half the size of gm is achieved by elongating the gate length of a transistor.

In the configuration described above, the reference cell array 31 has two transistors of reference cells connected in series, thereby providing gm that is half the size of that of the transistors of memory cells. It should be noted that a single transistor may be used instead of two transistors connected in series, and the gate length of this transistor may be elongated so as to provide gm half as large. FIG. 4 is a drawing showing a construction in which half the size of gm is achieved by elongating the gate length of a transistor. As shown in FIG. 4, a single transistor MR3 having the gate length thereof elongated may be used in place of the two transistors MR0 and MR1 connected in series, thereby providing gm half as large.

Figure 5:
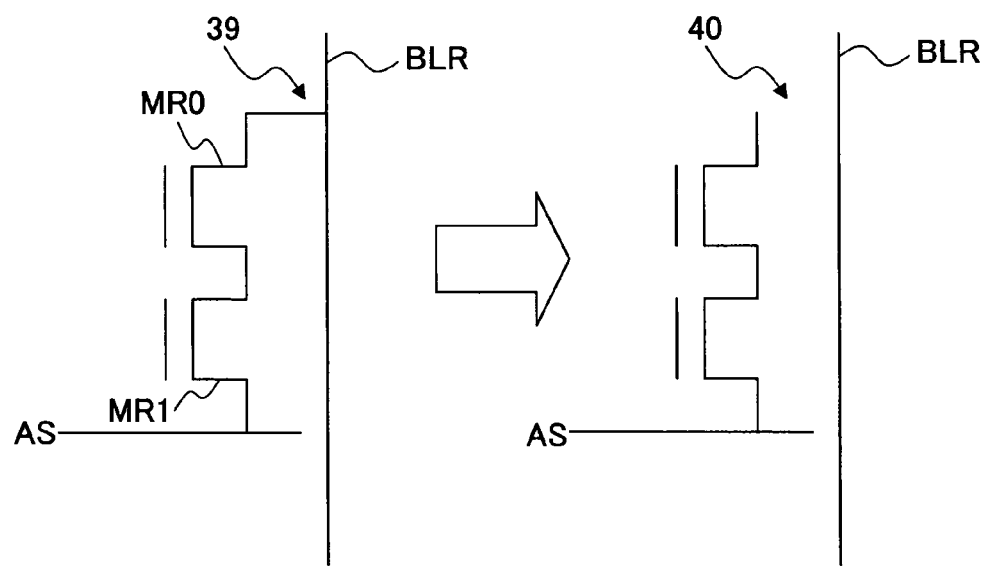
FIG. 5 is a drawing showing a construction in which an electrical connection between a transistor and a bit line is severed.

In the configuration described above, further, the reference cells MRR00 through MRR30 of the reference cell portion 31-3 have "1" stored therein. Alternatively, the nonvolatile semiconductor memory device may be manufactured such that the reference cells MRR00 through MRR30 are not electrically connected to the reference-purpose bit line BLR. Even in this case, the reference cells MRR00 through MRR30 having no electrical connection are preferably created in order to maintain a repeating structure of the array. FIG. 5 is a drawing showing a construction in which an electrical connection between a transistor and a bit line is severed. As shown in FIG. 5, a severance portion 40 is provided so as to prevent a drain node 39 of the transistor MR0 from being connected to the reference-purpose bit line BLR. In this manner, an electric current flowing from the reference-purpose bit line BLR can be blocked.

Figure 6:
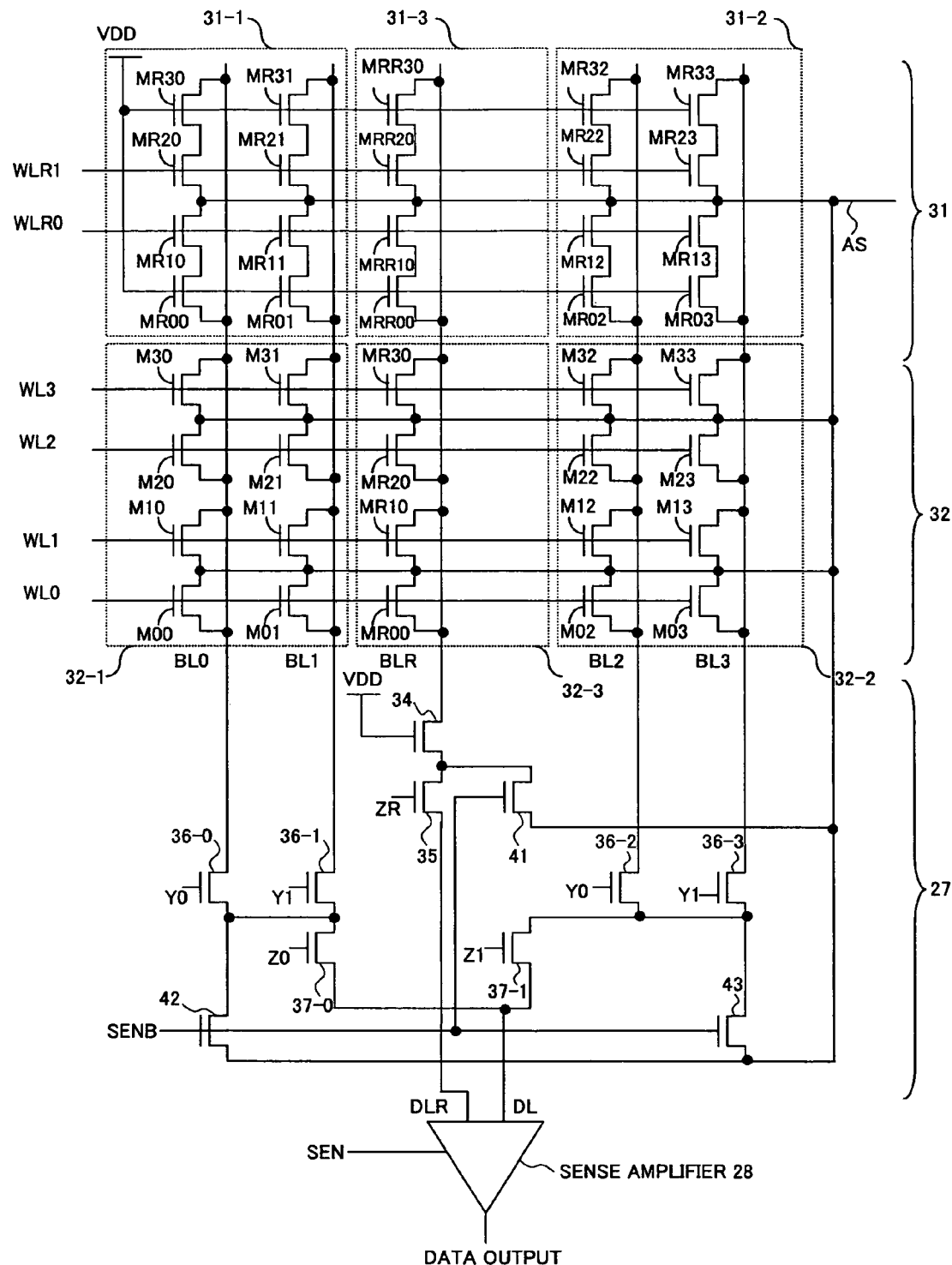
FIG. 6 is a circuit diagram showing the construction of the reference cell array, the memory cell array, and the bit-line selecting gate according to another embodiment.

FIG. 6 is a circuit diagram showing the construction of the reference cell array 31, the memory cell array 32, and the bit-line selecting gate 27 according to another embodiment. In FIG. 6, the same elements as those of FIG. 3 are referred to by the same numerals, and a description thereof will be omitted.

The construction shown in FIG. 6 differs from that of FIG. 3 in that transistors 41 through 43 are provided in the bit-line selecting gate 27. The remaining portion is the same as the construction shown in FIG. 3.

The transistors 41 through 43 receive a signal SENB supplied from the control circuit 21 shown in FIG. 2, so that the conductive/nonconductive state of these transistors is controlled according to the signal SENB. The signal SENB becomes HIGH at the completion of a sensing operation. When the signal SENB changes to HIGH, the transistors 41 through 43 become conductive, so that a selected bit line and the reference-purpose bit line BLR are coupled to the array source AS, resulting in the electric change of these bit lines being discharged to the source potential. This ensures that the potentials of the selected bit line and the reference-purpose bit line BLR are set to the potential of the array source before a next read operation starts.

With the construction shown in FIG. 3, no potential is applied by the input terminal DL of the sense amplifier 28 after a read operation (sensing operation) comes to an end. The potential of the selected bit line thus approaches the potential of the array source through the reference cells of the reference cell array 31. Since gm of the reference cell array 31 is set to a relatively small value, however, the speed at which the bit line potential approaches the array source potential is slow. When read operations are performed consecutively, thus, there may be a situation in which an unselected bit line is not fixed to the array source potential. When such a situation occurs, the sensing of data may be affected by the presence of capacitance between bit lines in the same manner as in the conventional art.

With the construction shown in FIG. 6, on the other hand, the potentials of the bit lines are compulsorily set to the array source potential through the bit-line discharging transistors 41 through 43 at the end of a read operation (sensing operation). Such compulsory discharging of bit lines at the end of a read operation achieves a stable operation without interference between bit lines even when the cycle of read operations is short.

Figure 7:
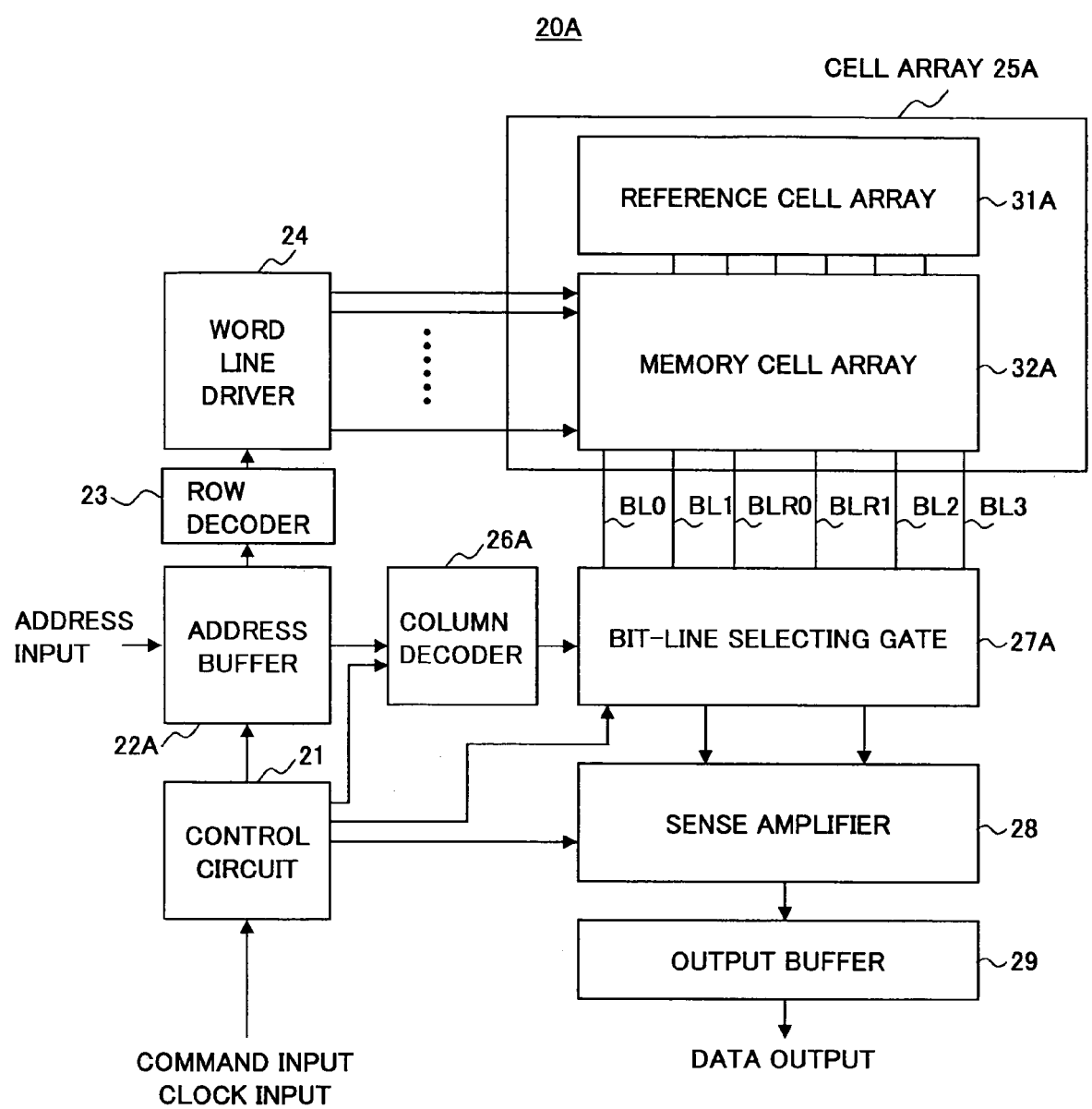
FIG. 7 is a block diagram showing the construction of a nonvolatile semiconductor memory device according to a second embodiment of the invention.

FIG. 7 is a block diagram showing the construction of a nonvolatile semiconductor memory device according to a second embodiment of the invention. In FIG. 7, the same elements as those of FIG. 2 are referred to by the same numerals, and a description thereof will be omitted.

A nonvolatile semiconductor memory device 20A of FIG. 7 includes the control circuit 21, an address buffer 22A, the row decoder 23, the word line driver 24, a cell array 25A, a column decoder 26A, a bit-line selecting gate 27A, the sense amplifier 28, and the output buffer 29. The cell array 25A includes a reference cell array 31A and a memory cell array 32A.

In the construction of the nonvolatile semiconductor memory device 20 of FIG. 2, one of the two sets of reference cells, which have symmetric arrangement with each other in the reference cell array 31, is selected according to a signal from the address buffer 22. In the construction of the nonvolatile semiconductor memory device 20A of FIG. 7, on the other hand, no signal is supplied from the address buffer 22A to the reference cell array 31A for the purpose of selecting one of the symmetrical arrangements. Alternatively, the bit-line selecting gate 27A achieves a function to select one of the symmetrical arrangements in response to a signal from the column decoder 26A. This provision eliminates a need for the reference-cell word-line driver 30.

Figure 8:
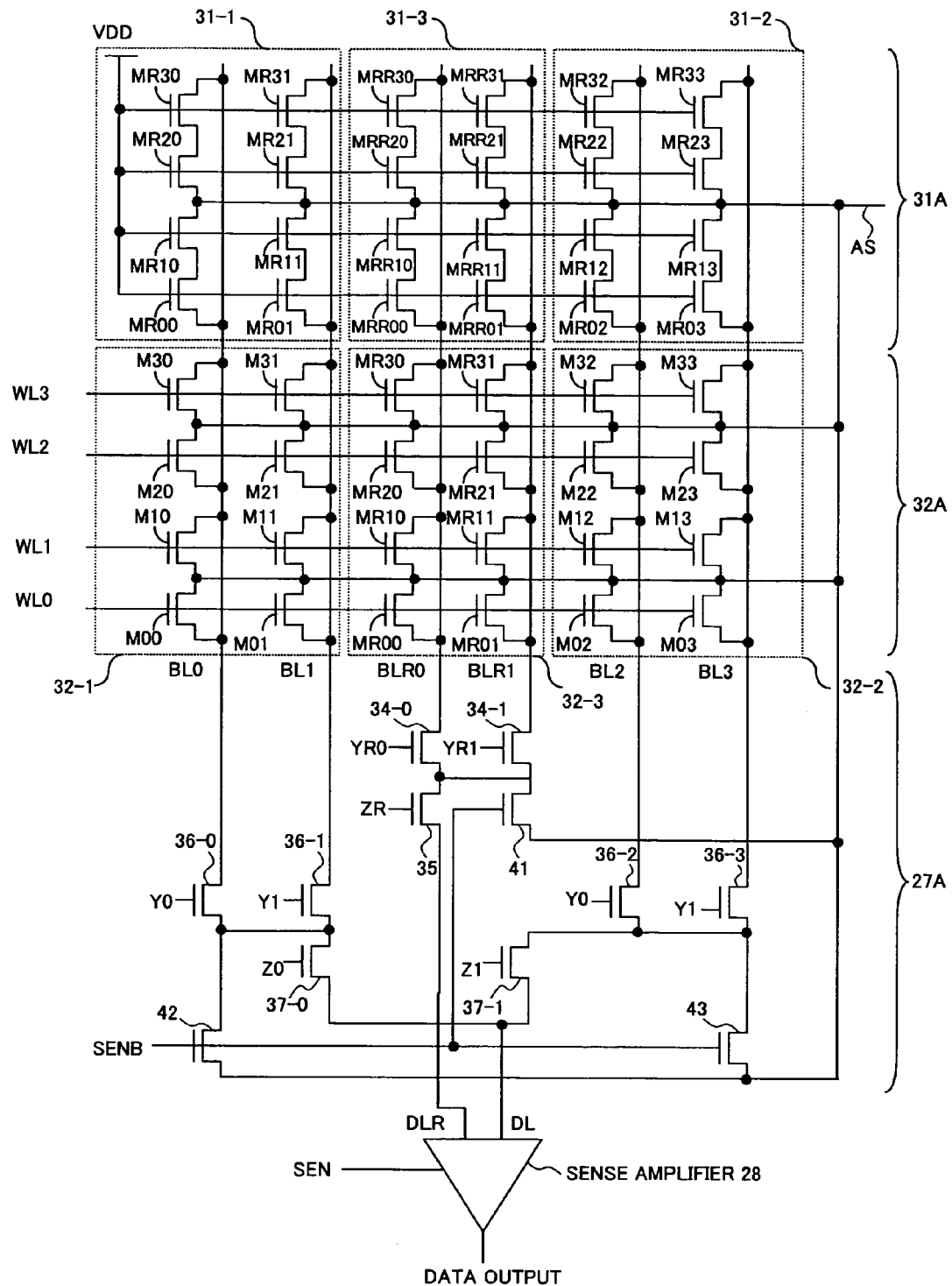
FIG. 8 is a circuit diagram showing the construction of a reference cell array, a memory cell array, and a bit-line selecting gate shown in FIG. 7.

FIG. 8 is a circuit diagram showing the construction of the reference cell array 31A, the memory cell array 32A, and the bit-line selecting gate 27A. In FIG. 8, the same elements as those of FIG. 6 are referred to by the same numerals, and a description thereof will be omitted.

The construction of FIG. 8 differs from the construction of FIG. 6 in that two reference-purpose bit lines BLR0 and BLR1 are provided in place of the reference-purpose bit line BLR, and two transistors 34-0 and 34-1 are provided in place of the transistor 34 for the purpose of selecting one of these two bit lines. In the reference cell portion 31-3 and the memory cell portion 32-3, cell transistors are connected to the two bit lines BLR0 and BLR1.

The transistors 41 through 43 receive a signal SENB supplied from the control circuit 21 shown in FIG. 2, so that the conductive/nonconductive state of these transistors is controlled according to the signal SENB. The signal SENB becomes HIGH at the completion of a sensing operation. When the signal SENB changes to HIGH, the transistors 41 through 43 become conductive, so that a selected bit line and a reference-purpose bit line are coupled to the array source AS, resulting in the electric change of these bit lines being discharged to the source potential. This ensures that the potentials of the selected bit line and the reference-purpose bit line are set to the potential of the array source before a next read operation starts.

With the construction shown in FIG. 8, bit line potential is compulsorily set to the array source potential through the bit-line discharging transistors 41 through 43 at the end of a read operation (sensing operation). Because of this, provision may be made to allow only an electric current commensurate with data stored in a selected memory cell to flow through a selected bit line in the same manner as in the conventional construction. That is, all the reference cells in the reference cell portions 31-1 and 31-2 are given data "1" as storage data, so that the cell transistors are placed in a nonconductive state. With this provision, the amount of an electric current flowing through a selected bit line is 0 if data "1" is stored in the selected memory cell, and is Icel0 if data "0" is stored in the selected memory cell.

In the reference cell portion 31-3, data "0" is stored in the reference cells MRR00 and MRR10 to make them conductive, and data "0" is further stored in the reference cells MRR21 and MRR31 to make them conductive. Moreover, data "1" is stored in the reference cells MRR20 and MRR30 to make them nonconductive, and data "1" is further stored in the reference cells MRR01 and MRR11 to make them nonconductive. In the reference-purpose memory cell portion 32-3, all the memory cells are given "1" as storage data so as to be placed in a nonconductive state.

When the even-numbered word line WL0 or WL2 is selected in the memory cell array 32A, the gate transistor 34-0 of the bit-line selecting gate 27A is made conductive in response to a signal YR0 supplied from the column decoder 26A, thereby selecting the reference-purpose bit line BLR0. When the odd-numbered word line WL1 or WL3 is selected in the memory cell array 32A, the gate transistor 34-1 of the bit-line selecting gate 27A is made conductive in response to a signal YR1 supplied from the column decoder 26A, thereby selecting the reference-purpose bit line BLR1. This makes it possible to provide an electric current equal in amount to 0.5Icel0 flowing through the selected reference-purpose bit line while absorbing differences in the characteristics of memory cell arrays having a symmetrical structure.

The sense amplifier 28 performs the sensing of data according to the magnitude relationship between the data current that is either 0 or Icel0 and the reference current that is 0.5Icel0.

With the construction shown in FIG. 8, the potentials of the bit lines are compulsorily set to the array source potential through the bit-line discharging transistors 41 through 43 at the end of a read operation (sensing operation). The compulsory discharging of bit lines at the end of a read operation ensures that a stable operation without interference between bit lines is achieved even when the cycle of read operations is short. Moreover, compared with the constructions shown in FIG. 3 and FIG. 6, current consumption is reduced by 0.5Icel0, thereby achieving reduction in power consumption.

The construction shown in FIG. 8 has an advantage in that power consumption is reduced. When such design rule is employed that interference due to capacitance between bit lines becomes conspicuous, however, an electric current equal in amount to 0.5Icel0 may be added in the same manner as in the constructions shown in FIG. 3 and FIG. 6. To achieve this, data stored in the reference cells may simply be changed in the circuit construction of FIG. 8. That is, in the reference cell portions 31-1 and 31-2, "0" is stored in one of the two sets of reference cells that have symmetrical structures with each other, thereby being placed in a conductive state. For example, the reference cells MR00 through MR03 and MR10 through MR13 are given "0" as storage data, thereby pulling in an electric current equal in amount to 0.5Icel0 from the selected bit line. The other set of symmetrical reference cells, i.e., the reference cells MR20 through MR23 and MR30 through MR33, are given "1" as storage data, thereby being placed in a nonconductive state. With this provision, the amount of an electric current flowing through the selected bit line is 0.5Icel0 if data "1" is stored in the selected memory cell, and is 1.5Icel0 if data "0" is stored in the selected memory cell.

In the reference cell portion 31-3, data "1" is stored in all the reference cells to make them nonconductive. In the memory cell portion 32-3, "0" is stored in all the memory cells to make them conductive. This provides for an electric current equal in amount to Icel0 to flow through the selected reference-purpose bit line.

The sense amplifier 28 performs the sensing of data according to the magnitude relationship between the data current that is either 0.5Icel0 or 1.5Icel0 and the reference current that is Icel0. With this construction, a discharging path is provided from the selected bit line to the array source potential through a reference cell, and, also, the bit line potential is compulsorily set to the array source potential after the end of a read operation. This achieves a stable operation without interference between bit lines even when the cycle of read operations is short.

As can be seen from the description provided above, switching between the construction with the addition of 0.5Icel0 and the construction without such addition can be made through the writing of data in memory cells and reference cells. The circuit construction that is extremely robust against noise and the circuit construction that is fairly robust against noise and has reduced power consumption are thus switched through such a simple operation as the writing of different data. It should be noted that, as described in connection with FIG. 5, the switching of circuit constructions may alternatively be achieved by changing electrical circuit connections instead of changing data.

Further, the present invention is not limited to these embodiments, but various variations and modifications may be made without departing from the scope of the present invention.

The above embodiments have been described with reference to a construction in which the reference cells as well as the memory cells have a symmetrical structure. It should be noted, however, that where an effect of process-mask displacement is small, there may be no need to switch selected reference cells according to whether the word address is an even-numbered address or an odd-numbered address.

Moreover, the above embodiments have been described with reference to a case in which a reference-purpose bit line is situated at such a location as the source-line resistance is largest and the cell current is smallest, and in which the reference cells are situated farthest away on the bit lines from the sense amplifier. Such arrangement is not necessarily the same as that described in the embodiments, and circuit components may be positioned at other locations as required by design.

Moreover, although the above description has been provided by using a flash memory as an example of a nonvolatile semiconductor memory device, the present invention may as well be applied to a mask ROM or the like.

The present application is based on Japanese priority application No. 2003-306491 filed on Aug. 29, 2003, with the Japanese Patent Office, the entire contents of which are hereby incorporated by reference.

What is claimed is:

1. A nonvolatile semiconductor memory device, comprising:
    a first memory cell having a conductive/nonconductive state thereof substantially controlled in response to data stored therein and providing passage of a first current amount in the conductive state;
    a first bit line connected to said first memory cell;
    a reference cell connected to said first bit line and providing passage of a second current amount smaller than the first current amount, wherein said reference cell includes a plurality of transistors arranged in series, said transistors having a same dimension as a transistor of said first memory cell;
    a second bit line;
    a second memory cell connected to said second bit line and providing passage of the first current amount; and
    a sense amplifier connectable to said first bit line and said second bit line through electrical couplings.

2. The nonvolatile semiconductor memory device as claimed in claim 1, wherein the second current amount is substantially half the first current amount.

3. The nonvolatile semiconductor memory device as claimed in claim 2, wherein said reference cell has a gate length that is longer than that of said first memory cell.

4. The nonvolatile semiconductor memory device is claimed in claim 1, wherein said first memory cell, said second memory cell, and said reference cell are included in a unitary array structure.

5. The nonvolatile semiconductor memory device as claimed in claim 1, wherein said reference cell includes:
    a first reference cell connected to said first bit line; and
    a second reference cell connected to said first bit line, wherein one of said first reference cell and said second reference cell is selectively made conductive in response to a word address that selects said first memory cell.

6. A nonvolatile semiconductor memory device, comprising:
    a first memory cell having a conductive/nonconductive state thereof substantially controlled in response to data stored therein and providing passage of a first current amount in the conductive state;
    a first bit line connected to said first memory cell;
    a reference cell connected to said first bit line and providing passage of a second current amount smaller than the first current amount;
    a second bit line;
    a second memory cell connected to said second bit line and providing passage of the first current amount;

a sense amplifier connectable to said first bit line and said second bit line through electrical couplings; and transistors that couple said first bit line and said second bit line to a predetermined potential when said sense amplifier is not operating.

7. The nonvolatile semiconductor memory device as claims in claim 6, wherein said predetermined potential is connected to source nodes of said first memory cell, said second memory cell, and said reference cell.

8. The nonvolatile semiconductor memory device as claimed in claim 6, wherein the second current amount is substantially half the first current amount.

9. The nonvolatile semiconductor memory device as claimed in claim 8, wherein said reference cell has a gate length that is longer than that of said first memory cell.

10. The nonvolatile semiconductor memory device is claimed in claim 6, wherein said first memory cell, said second memory cell, and said reference cell are included in a unitary array structure.

11. The nonvolatile semiconductor memory device as claimed in claim 6, wherein said reference cell includes:
a first reference cell connected to said first bit line; and
a second reference cell connected to said first bit line, wherein one of said first reference cell and said second reference cell is selectively made conductive in response to a word address that selects said first memory cell.

12. A nonvolatile semiconductor memory device, comprising:
a memory cell having a conductive/nonconductive state thereof substantially controlled in response to data stored therein and providing passage of a first current amount in the conductive state;
a first bit line connected to said memory cell;
a second bit line;
a reference cell connected to said second bit line and providing passage of a second current amount smaller than the first current amount;
a sense amplifier connectable to said first bit line and said second bit line through electrical couplings; and
transistors configured to couple said first bit line and said second bit line to a predetermined potential when said sense amplifier is not operating.

13. The nonvolatile semiconductor memory device as claimed in claim 12, wherein said memory cell and said reference cell are included in a unitary array structure.

14. The nonvolatile semiconductor memory device as claim in claim 12, wherein the second current amount is substantially half the first current amount.

15. A nonvolatile semiconductor memory device, comprising:
a first memory cell having a conductive/nonconductive state thereof substantially controlled in response to data stored therein and providing passage of a first current amount in the conductive state;
a first bit line connected to said first memory cell;
a first reference cell connected to said first bit line and providing, in a conductive state, passage of a second current amount smaller than the first current amount;
a second bit line;
a second memory cell connected to said second bit line and providing passage of the first current amount in a conductive state;
a second reference cell connected to said second bit line and providing passage of the second current amount in a conductive state, wherein said first reference cell and said second memory cell are fixedly set to a conductive state, and said second reference cell is fixedly set to a nonconductive state; and
a sense amplifier connectable to said first bit line and said second bit line through electrical couplings.

16. A nonvolatile semiconductor memory device, comprising:
a first memory cell having a conductive/nonconductive state thereof substantially controlled in response to data stored therein and providing passage of a first current amount in the conductive state;
a first bit line connected to said first memory cell;
a first reference cell connected to said first bit line and providing, in a conductive state, passage of a second current amount smaller than the first current amount;
a second bit line;
a second memory cell connected to said second bit line and providing passage of the first current amount in a conductive state;
a second reference cell connected to said second bit line and providing passage of the second current amount in a conductive state, wherein said first reference cell and said second memory cell are fixedly set to a nonconductive state, and said second reference cell is fixedly set to a conductive state; and
a sense amplifier connectable to said first bit line and said second bit line through electrical couplings.

* * * * *